United States Patent [19]

Hiller

[11] Patent Number: 5,420,755

[45] Date of Patent: May 30, 1995

[54] CIRCUIT BOARD WITH ELECTRICAL COMPONENTS, IN PARTICULAR SURFACE-MOUNTED DEVICES

[76] Inventor: Peter Hiller, Obere Hurststr. 18, D-7144 Asperg, Germany

[21] Appl. No.: 90,141

[22] PCT Filed: Sep. 15, 1991

[86] PCT No.: PCT/FR91/00648

§ 371 Date: Jul. 15, 1993

§ 102(e) Date: Jul. 15, 1993

[87] PCT Pub. No.: WO92/03901

PCT Pub. Date: Mar. 5, 1992

[30] Foreign Application Priority Data

Aug. 18, 1990 [DE] Germany .................. 40 26 233.2

[51] Int. Cl.⁶ .................................. H05K 1/18
[52] U.S. Cl. ....................... 361/761; 361/748; 361/760; 174/260
[58] Field of Search ............ 361/761, 736, 748, 760; 174/255, 260, 267

[56] References Cited

U.S. PATENT DOCUMENTS 3,529,212 12/1967 Ballard .
4,878,155 10/1989 Conley .................. 361/401

FOREIGN PATENT DOCUMENTS 1514009 6/1969 Germany .
2346924 3/1975 Germany .
3115303 4/1982 Germany .
3430849 3/1986 Germany .

Primary Examiner—Leo P. Picard
Assistant Examiner—Young Whang
Attorney, Agent, or Firm—Speckman, Pauley & Fejer

[57] ABSTRACT

A circuit board with electrical components in which the components are inserted with their insulated bodies into through bores of the circuit board, slightly protruding from the underside and top of the board, and having contact surfaces which are soldered to a strip conductor. The lower ends of the components terminate in a hemispherical cup or rounded conical tip and have at least one lower contact surface protruding into the strip conductor and soldered to it. The upper ends of the components comprise a plurality of upper contact surfaces insulated from each other and connected to a plurality of contact elements protruding from the component body. The contact elements are connected at a distance around the bores to the strip conductor on top of the circuit board by soldering paste.

16 Claims, 2 Drawing Sheets 5,420,755

CIRCUIT BOARD WITH ELECTRICAL COMPONENTS, IN PARTICULAR SURFACE-MOUNTED DEVICES

BACKGROUND OF THE INVENTION

1. Field of the Invention

This invention relates to a circuit board with electrical components in which the components are inserted with their insulated component bodies into through-bores of the circuit board, slightly protruding from the underside of the circuit board and the top of the circuit board and having contact surfaces in these areas which are soldered to strip conductors. The lower ends of the components terminate in the shape of hemispherical cups or rounded conical tips and have appropriate lower contact surfaces protruding into the strip conductors, embodied as lands, and are soldered to them.

2. Description of Prior Art

A circuit board of this type is taught by German Patent Reference DE 31 15 303 and U.S. Pat. No. 4,878,155. In accordance with the teachings of these references, each component is embodied as an individual element, such as a resistor, capacitor, diode or the like, so that it is not possible to attain a high component density of the components on the circuit board.

SUMMARY OF THE INVENTION

It is an object of this invention to provide a circuit board of the type discussed above wherein the component configurations permit, along with rapid and automatic assembly and soldering, a considerably increased component density.

This object is achieved in accordance with one embodiment of this invention where the upper ends of the components have a plurality of upper contact surfaces which are insulated from each other and which are connected to contact elements protruding from the component body. The contact elements are connected at a distance around the bores of the circuit board to strip conductors on the top of the circuit board by soldering paste.

The components are embodied as multi-elements with individual contact elements which are connected by soldering paste to the strip conductors on the top of the circuit board without the danger of a soldering bridge formation. The lower contact element is connected to the underside of the circuit board in a conventional soldering bath.

Excellent large-surface soldering of the lower contact surfaces of the components in the soldering bath is obtained where the lower contact surfaces partially protrude into the bores of the circuit board from the underside of the circuit board and where the lands on the underside of the circuit board extend almost to the bores. In this way, the solder is pulled up at the contact surface.

To increase the distance of the upper centered contact surfaces to the bore in accordance with one embodiment of this invention the upper contact elements define an acute angle with the top of the circuit board.

In accordance with another embodiment of this invention the upper contact surface with the contact elements is embodied as circular contact springs extending only over parts of the circumference of the upper end of the component.

In accordance with yet a further embodiment of this invention the upper end of the component is polygonal in cross-section and provided with individual contact elements. As a result, the component can also extend beyond the bore and in this way its construction can be considerably enlarged and offer the opportunity to attach a plurality of upper contact elements.

The mechanical fixation of the components in the bores can be accomplished by a snug fit and/or press fit. In this connection, resilient outer layers of the components can also be advantageous.

In accordance with yet another embodiment of this invention, mechanical fixation is accomplished where the component body of the component is maintained sealed in the area of the bore of the circuit board by bars extending around it.

To enable identification of the component used even when assembled on the circuit board in accordance with embodiment of this invention the upper contact elements have different forms.

The connection variants for the component can also be increased where the lower contact surface and the land are also divided into several contact points insulated from each other.

BRIEF DESCRIPTION OF THE DRAWINGS

This invention will be better understood from the following detailed description in conjunction with the drawings wherein.

DESCRIPTION OF PREFERRED EMBODIMENTS

Figure 1:
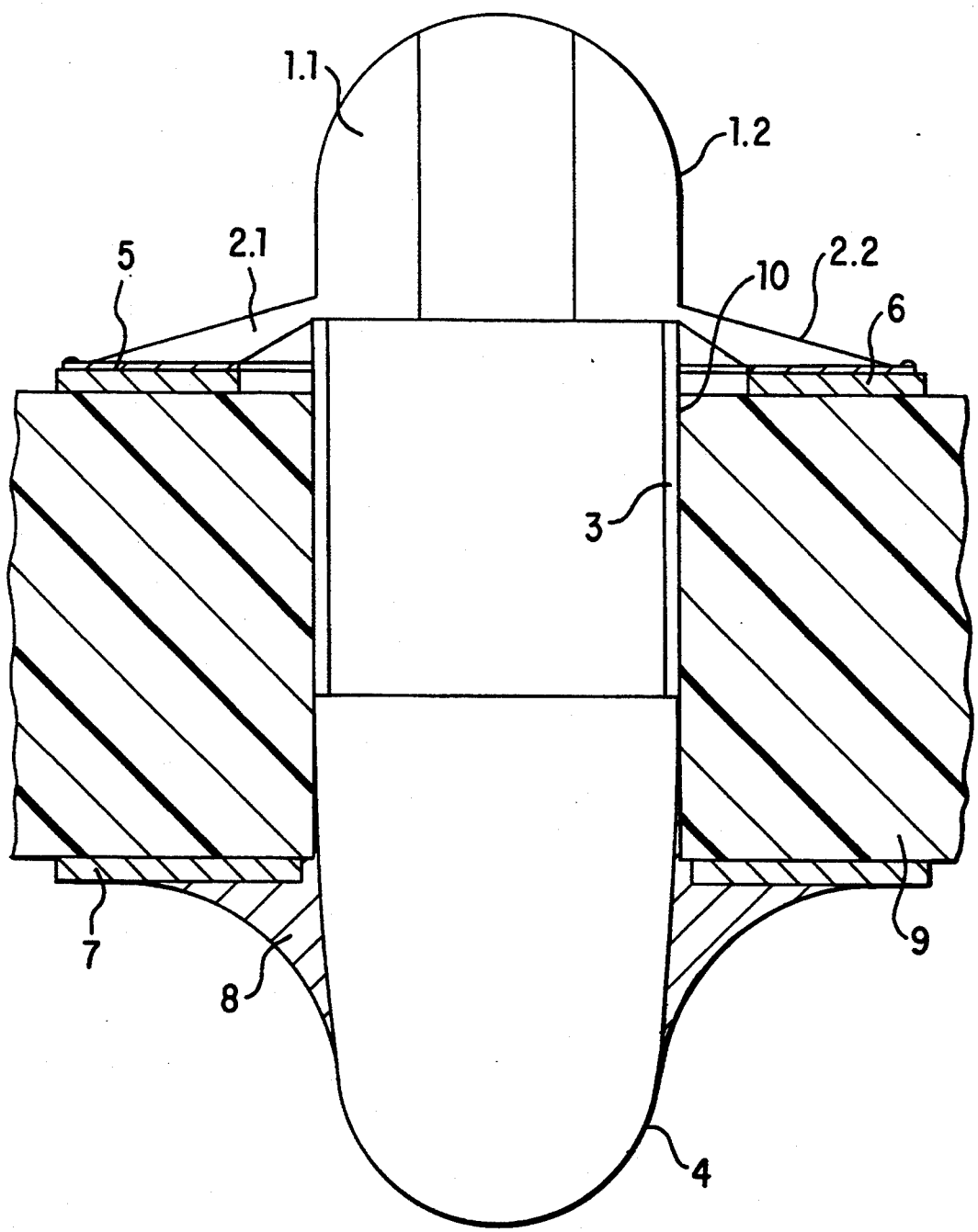
FIG. 1 is a partial cross-sectional view in accordance with one embodiment of this invention of a component with a plurality of upper contact elements.

A portion of a circuit board 9 with a bore 10 is shown in FIG. 1. The component having component body 3 is inserted into bore 10 and mechanically maintained therein, for example, by snug fit and/or press fit. The lower end of the component, preferably manufactured as a surface-mounting device, is embodied as a spherical cup projecting from lower end of the bore 10. land 7, extending close to the bore 10, is placed on the underside of the circuit board around bore 10. The component body 3 insulates the lower contact surface 4, which extends from the hemispherical cup toward the periphery of said bore 10 at an angle with respect to said periphery and partially into bore 10. As a result, the gradual rise of lower contact surface 4 within bore 10 provides a rise of the solder 8 during the soldering process. The upper end of the component extends out of the top of the circuit board and supports the upper contact surface 1.1 and 1.2 which is connected to the contact elements 2.1 and 2.2. The annular, but divided, strip conductor 6, applied to the soldering paste 5, extends around the bore at a predetermined distance. The contact elements 2.1 and 2.2 are embodied as protruding contact springs, which are at an acute angle with respect to the component body 3 and are supported on the annular divided strip conductor 6, and are electrically conducting through the soldering paste 5. In this way, the component is seated, protected in the bore 10 of the circuit board 9, and does not require a bore for providing a contact through it for its electrical connection. Therefore, very little space around bore 10 is utilized. The spacing between the divided strip conductor 6 and bore 10 assures that no soldering paste can enter the bore during placement of the component. The land 7 on the underside of the circuit board must be sufficiently large so that it and also the lower contact surface 4 are covered by solder in the soldering bath, in the course of which a groove is formed which, in addition to providing an excellent electrical connection, also results in secure fastening of the component.

The component is pressed into the bore 10 from the direction of the top of the circuit board until the contact elements 2.1 and 2.2 dip into the soldering paste 5 on the divided strip conductor 6. The component is fixed by the adhesive force of the soldering paste 5 and by the pressure and/or fitting force between the bore 10 and the components. Thus no clinching or gluing is required. Then the circuit board is placed into a furnace (reflow soldering). This is also required with surface mounted components. At the end, the underside of the circuit board is soldered in the soldering bath (wave soldering).

Figure 2:
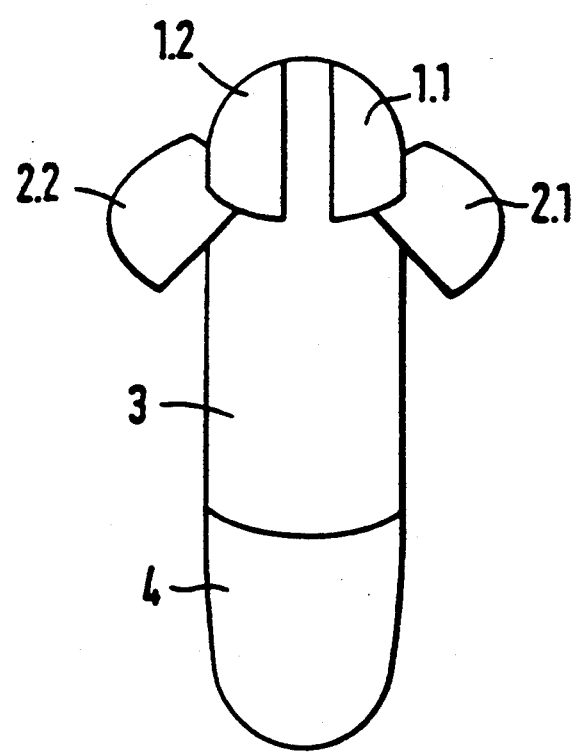
FIG. 2 is a diagram of a component with an enlarged upper end and differently designed contact elements in accordance with one embodiment of this invention.

FIG. 2 shows the component at a reduced scale in contrast with FIG. 1 and clearly shows its compact shape. As shown in FIG. 2, the upper contact surface is divided into two contact surfaces 1.1 and 1.2, which are insulated from each other and are then connected through the contact elements 2.1 and 2.2 to circular partial strip conductors 6. The contact elements 2.1 and 2.2 only extend over a portion of the circumference of the upper end of the component. The lower contact surface 4 can also be divided into a plurality of partial contact surfaces insulated in respect to each other. In this way it is possible to house double resistors, double diodes or double capacitors as well as multipolar semiconductors in the component body 3. It is also possible to integrate multipolar circuits.

Figure 3:
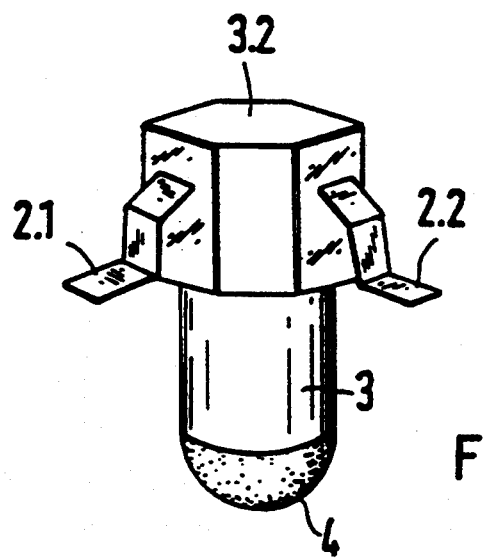
FIG. 3 is a perspective of the top of a component in accordance with another embodiment of this invention.

As shown in FIG. 3, the upper end of the component body 3 may also have a polygonal head 3.2 and cover the bore 10 on all sides. The exterior surfaces of the head 3.2 can all or alternatingly be provided with contact surfaces and contact elements 2.1 and 2.2.

Many variants of the embodiment of the head are conceivable. Further possibilities and embodiments for the division of the contact surfaces can also result. It is essential that the component is pre-fixed in the bore 10 and that the contact elements of the upper contact surfaces can be soldered in the furnace without soldering paste entering the bore. Finally, the embodiment of the lower contact surfaces should be chosen such that soldering in a soldering bath is easily possible.

I claim:

1. In a circuit board with a plurality of electrical components where each of the electrical components is inserted with an insulated component body into a through-bore of the circuit board, protruding from an underside of the circuit board and a top of the circuit board and having at least one contact surface which is soldered to a strip conductor, and where a lower end of each of the electrical components terminates in a shape of one of a hemispherical cup and a rounded conical tip and has at least one lower contact surface protruding into the strip conductor embodied as a land and soldered to it, the improvement comprising:
an upper end of each of the electrical components comprising a plurality of upper contact surfaces (1.1, 1.2) insulated from each other and connected to a plurality of contact elements (2.1, 2.2) protruding from said insulated component body (3), said contact elements connected at a distance around the through-bore (10) of the circuit board (9) to the strip conductor (6) on the top of the circuit board (9) by soldering paste.

2. In a circuit board in accordance with claim 1, wherein
the at least one lower contact surface (4) partially protrudes into the through-bore (10) of the circuit board (9) from the underside of the circuit board (9), and the land (7) on the underside of the circuit board (9) extends almost to the through-bore (10).

3. In a circuit board in accordance with claim 2, wherein
each of the contact elements (2.1, 2.2) forms an acute angle with the insulated component body (3).

4. In a circuit board in accordance with claim 3, wherein
at least one of the upper contact surfaces with one of the contact elements (2.1, 2.2) are embodied as a one-piece contact cap on the upper end of at least one of the electrical components which is provided with contact surfaces.

5. In a circuit board in accordance with claim 4, wherein
at least one of the contact elements is embodied as one of a circular annular contact spring and a plurality of circular contact springs extending over parts of the circumference of the upper end of at least one of the electrical components.

6. In a circuit board in accordance with claim 5, wherein
the upper end (3.2) of at least one of the electrical components is polygonal in cross-section and is provided with a plurality of individual contact elements (2.1, 2.2) on an exterior surface of said upper end (3.2).

7. In a circuit board in accordance with claim 6, wherein
the insulated component body (3) of at least one of the electrical components is maintained sealed in an area of the through-bore (10) of the circuit board (9) by a plurality of bars extending around it.

8. In a circuit board in accordance with claim 7, wherein
at least two of the contact elements (2.1, 2.2) have different forms.

9. In a circuit board in accordance with claim 8, wherein
the at least one lower contact surface (4) and the land (7) are divided into a plurality of contact points insulated from each other.

10. In a circuit board in accordance with claim 1, wherein
each of the contact elements (2.1, 2.2) forms an acute angle with the insulated component body (3).

11. In a circuit board in accordance with claim 1, wherein
at least one of the upper contact surfaces with the contact elements (2.1, 2.2) are embodied as a one-piece contact cap on the upper end of at least one of the electrical components which is provided with contact surfaces.

12. In a circuit board in accordance with claim 1, wherein
at least one of the contact elements is embodied as one of a circular annular contact spring and a plurality of circular contact springs extending over parts of the circumference of the upper end of at least one of the electrical components.

13. In a circuit board in accordance with claim 1, wherein
the upper end (3.2) of a least one of the electrical components is polygonal in cross-section and is provided with a plurality of individual contact elements (2.1, 2.2) on an exterior surface of said upper end (3.2).

14. In a circuit board in accordance with claim 1, wherein
the insulated component body (3) of at least one of the electrical components is maintained sealed in an area of the through-bore (10) of the circuit board (9) by a plurality of bars extending around it.

15. In a circuit board in accordance with claim 1, wherein
at least two of the contact elements (2.1, 2.2) have different forms.

16. In a circuit board in accordance with claim 1, wherein
the at least one lower contact surface (4) and the land (7) are divided into a plurality of contact points insulated from each other.

* * * * *